(12) United States Patent
Messmore et al.

(10) Patent No.: US 9,153,151 B2
(45) Date of Patent: Oct. 6, 2015

(54) SIGN VENTILATION SYSTEM

(71) Applicants: Ryan Messmore, Danville, IL (US);
Byron Hall, Urbana, IL (US); Larry
Smith, Danville, IL (US); Jeff
Koebrich, Danville, IL (US)

(72) Inventors: Ryan Messmore, Danville, IL (US);
Byron Hall, Urbana, IL (US); Larry
Smith, Danville, IL (US); Jeff
Koebrich, Danville, IL (US)

(73) Assignee: Time-O-Matic, LLC., Danville, IL (US)

( * ) Notice: Subject to any disclaimer, the term of this patent is extended or adjusted under 35 U.S.C. 154(b) by 375 days.

(21) Appl. No.: 13/751,882

(22) Filed: Jan. 28, 2013

(65) Prior Publication Data
US 2013/0201685 A1 Aug. 8, 2013

Related U.S. Application Data

(60) Provisional application No. 61/591,796, filed on Jan. 27, 2012.

(51) Int. Cl.
G09F 13/04 (2006.01)
G09F 13/22 (2006.01)
F21V 29/02 (2006.01)
G09F 9/33 (2006.01)
H05K 7/20 (2006.01)

(52) U.S. Cl.
CPC ............... *G09F 13/22* (2013.01); *F21V 29/02* (2013.01); *G09F 9/33* (2013.01); *H05K 7/20* (2013.01); *H05K 7/20972* (2013.01)

(58) Field of Classification Search
CPC ........ F21V 29/02–29/027; G09F 13/00–13/46
USPC .................. 362/97.1, 97.4, 812; 40/564, 573
See application file for complete search history.

(56) References Cited

U.S. PATENT DOCUMENTS

| 5,991,153 | A | 11/1999 | Heady et al. |
| 7,716,861 | B2 | 5/2010 | Stadjuhar, Jr. |
| 7,823,308 | B1 | 11/2010 | Munson et al. |
| 7,926,213 | B1 | 4/2011 | Kludt et al. |
| 8,046,942 | B1 | 11/2011 | Kludt et al. |
| 2008/0220549 | A1 | 9/2008 | Nall et al. |
| 2011/0072697 | A1* | 3/2011 | Miller ............................. 40/564 |

* cited by examiner

*Primary Examiner* — Sean Gramling
(74) *Attorney, Agent, or Firm* — Stephen F. Rost; Taft Stettinius & Hollister LLP

(57) ABSTRACT

An electronic sign includes a planar lighting module emitting visible light. A cabinet supportingly engages the lighting module. An air chamber is between the cabinet and the lighting module. A vertical partition is within the air chamber and extends between a bottom wall and a top wall of the cabinet, and between the lighting module and a rear wall of the cabinet. The partition divides the air chamber into first and second sections. An electric fan is within the cabinet and transfers air from the first to the second section. The cabinet and/or the lighting module include a plurality of throughholes fluidly interconnecting the air chamber to ambient air. A first subset of the throughholes are more closely fluidly connected to the first section than to the second section. A second subset of the throughholes are more closely fluidly connected to the second section than to the first section.

8 Claims, 7 Drawing Sheets

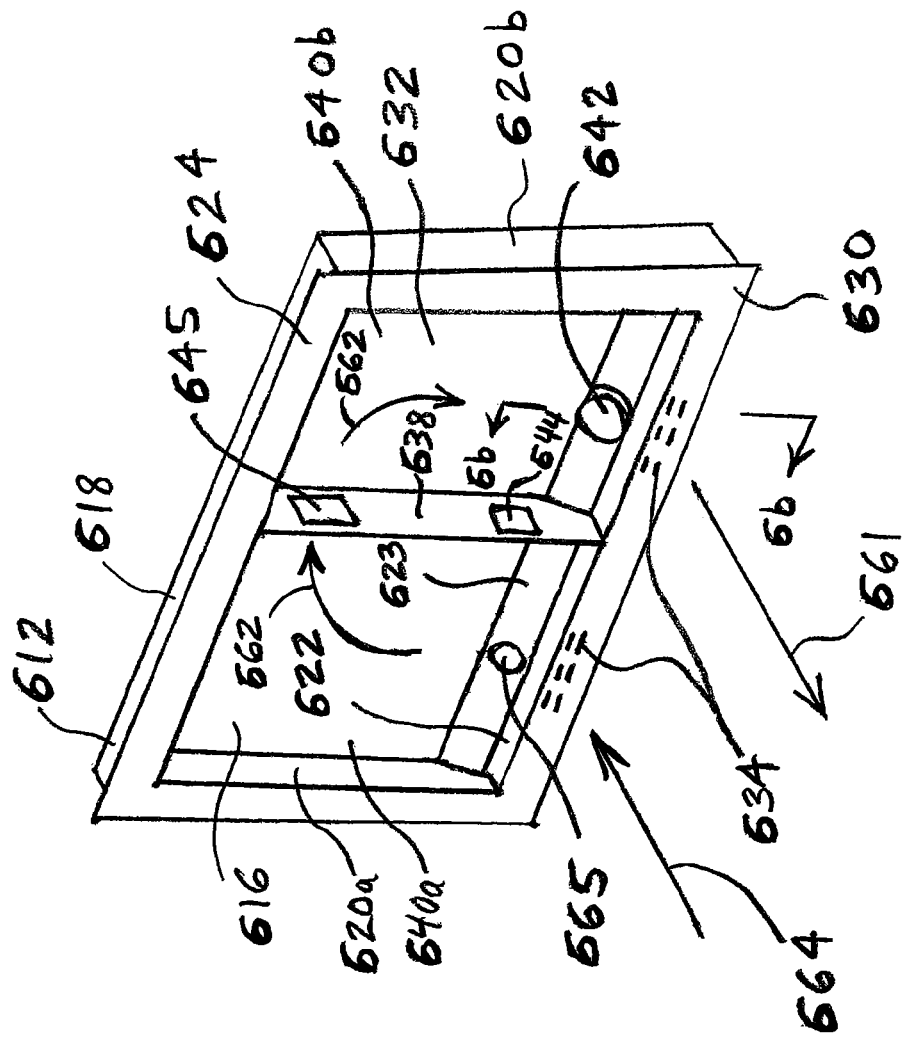

SIGN VENTILATION SYSTEM

RELATED APPLICATIONS

This application is a non-provisional of, and claims the benefit of, provisional application 61/591,796, filed Jan. 27, 2012, entitled "Multi-Chamber Sign Ventilation System", by applicants Ryan Messmore, Byron Hall, Larry Smith and Jeff Koebrich, which is hereby incorporated by reference herein in its entirety.

BACKGROUND OF THE INVENTION

1. Field of the Invention

The present invention relates to a system and method of ventilating an electronic sign.

2. Description of the Related Art

LED outdoor signs require ventilation to cool the internal electronics and also to remove heat from the backs of the LED modules or tiles that form the face of the cabinet. Since the front of the sign is made up of LED modules, the back or sides are used for ventilation (air intake and exhaust).

Customers often prefer to mount the cabinets against walls or enclosed in structures for esthetic reasons. This blocks the fresh air supply to the back or sides, leaving the front as the only option for ventilation.

Earlier designs pulled air in from the sides and exhausted out the front using small holes or louvers between the pixel elements of the sign. This approach is limited in that the cool air may not reach the center of a relatively large sign.

SUMMARY OF THE INVENTION

The invention may provide a relatively large electronic sign that is divided into horizontally adjacent chambers. Each of the chambers may have its own ventilation system. In this way, a sign of any size may be provided with adequate ventilation throughout its width.

Each chamber may include a vertical partition in the middle of the chamber such that the chamber is divided by the partition into two sections. The partition may include one or more throughholes to enable air to pass between the two sections. An electric fan is installed in one of the throughholes in order to force air to move from one section to the other section. The bottom side of each section of the chamber includes a series or array of vent holes to allow air to be drawn by the fan into one of the sections, be blown by the fan into the adjacent section, and to be blown out of the adjacent section through the vent holes. The vent holes may include baffles to prevent moisture, insects, and animals from entering the sign.

The invention comprises, in one form thereof, an electronic sign that is divided into one or more horizontally aligned chambers. Each chamber has a vertical partition in its middle holding one or more fans to move air from one side of the partition to the other. The air enters and exhausts from the chamber via a baffled slot across the bottom of the sign.

The invention comprises, in another form thereof, a ventilated electronic sign module including a substantially planar-shaped lighting module emitting light that is visible to a viewer of the sign. A cabinet supportingly engages the lighting module. The cabinet includes a rear wall, two opposing side walls, a top wall and a bottom wall. The rear wall is disposed opposite the lighting module such that an air chamber is defined between the cabinet and the lighting module. A substantially vertical partition is disposed within the air chamber and extends between the bottom wall and the top wall, and between the lighting module and the rear wall. The partition divides the air chamber into a first section and a second section. An electric fan is disposed within the cabinet and transfers air from the first section to the second section. The cabinet and/or the lighting module include a plurality of throughholes fluidly interconnecting the air chamber to ambient air. A first subset of the throughholes are more closely fluidly connected to the first section than to the second section. A second subset of the throughholes are more closely fluidly connected to the second section than to the first section.

The invention comprises, in yet another form thereof, an electronic sign including a plurality of ventilated electronic sign modules. The modules are substantially aligned in a horizontal direction. Each module is disposed horizontally adjacent to one or two other of the modules. Each of the modules includes a substantially planar-shaped lighting module emitting light that is visible to a viewer of the sign. A cabinet supportingly engages the lighting module. The cabinet includes a rear wall, two opposing side walls, a top wall and a bottom wall. The rear wall is disposed opposite the lighting module such that an air chamber is defined between the cabinet and the lighting module. A substantially vertical partition is disposed within the air chamber and extends between the bottom wall and the top wall, and between the lighting module and the rear wall. The partition divides the air chamber into a first section and a second section. An electric fan is disposed within the cabinet or within the lighting module and transfers air from the first section to the second section. The cabinet and/or the lighting module include a plurality of throughholes fluidly interconnecting the air chamber to ambient air. A first subset of the throughholes are more closely fluidly connected to the first section than to the second section. A second subset of the throughholes are more closely fluidly connected to the second section than to the first section.

The invention comprises, in still another form thereof, an electronic sign including a plurality of ventilated electronic sign modules. The modules are substantially aligned in a horizontal direction. Each module is disposed horizontally adjacent to one or two other of the modules. Each of the modules includes a substantially planar-shaped lighting module emitting light that is visible to a viewer of the sign. A cabinet supportingly engages the lighting module. The cabinet includes a rear wall, two opposing side walls, a top wall and a bottom wall. The rear wall is disposed opposite the lighting module such that an air chamber is defined between the cabinet and the lighting module. A substantially vertical partition is disposed within the air chamber and extends substantially an entire span between the bottom wall and the top wall, and extends substantially an entire span between the lighting module and the rear wall. The partition divides the air chamber into a first section and a second section. An electric fan is within the partition and transfers air from the first section to the second section. The cabinet and/or the lighting module have a plurality of throughholes fluidly interconnecting the air chamber to ambient air. A first subset of the throughholes are more closely fluidly connected to the first section than to the second section. A second subset of the throughholes are more closely fluidly connected to the second section than to the first section.

An advantage of the invention is that a middle portion of a sign that is relatively wide may be effectively cooled.

BRIEF DESCRIPTION OF THE DRAWINGS

FIG. 5b is a cross-sectional view along line 5b-5b in FIG. 5a.

FIG. 6a is a perspective view of still another embodiment of a cabinet suitable for a sign ventilation system of the present invention.

FIG. 6b is a cross-sectional view along line 6b-6b in FIG. 6a.

DESCRIPTION OF THE PRESENT INVENTION

Figure 1:
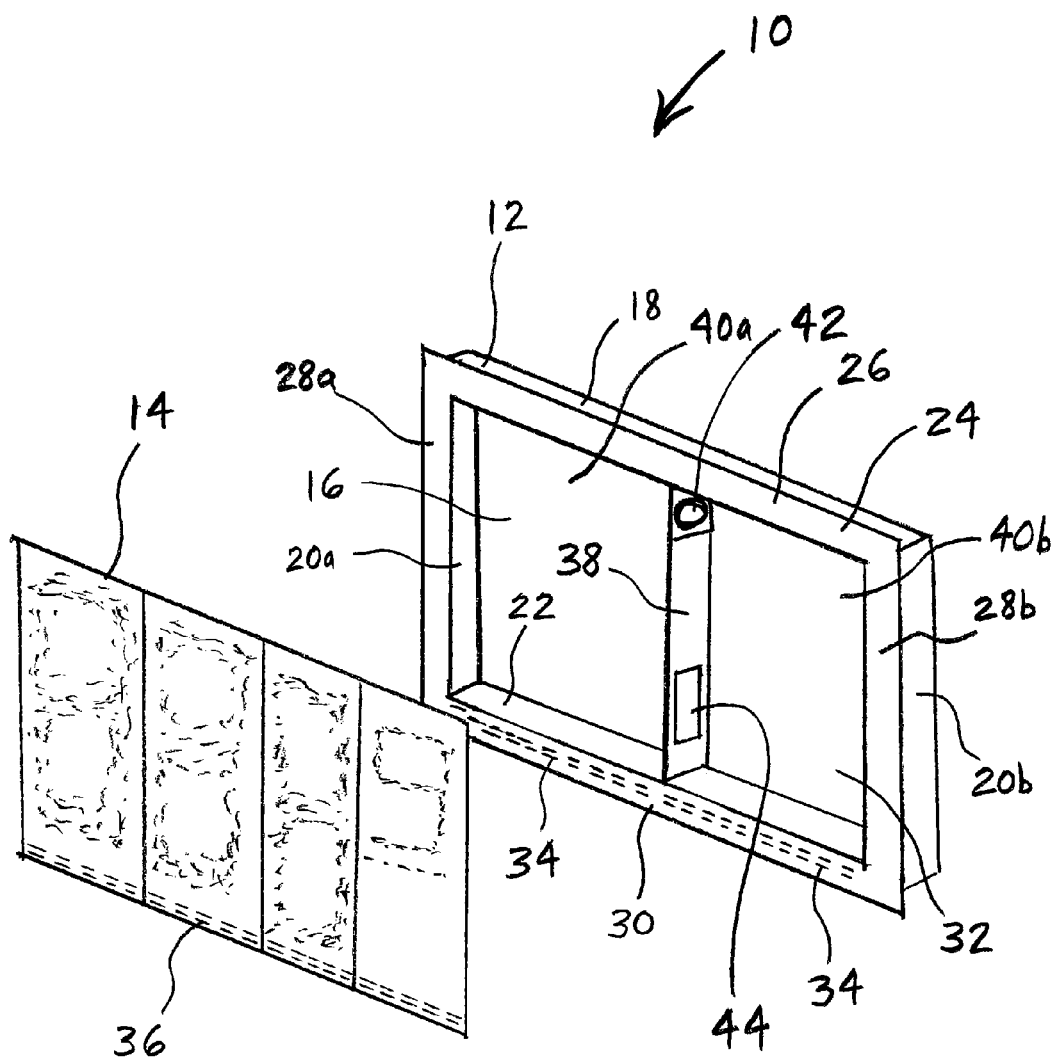
FIG. 1 is an exploded, perspective view of one embodiment of a sign ventilation system of the present invention.

Referring now to FIG. 1, there is shown a ventilated sign module 10 including a cabinet 12 and a digit panel 14. Digit panel 14 may also be referred to as a set of LED modules or tiles. Cabinet 12 may include a rear wall 16, top wall 18, side walls 20a-b, bottom wall 22, and a front frame 24 having top portion 26, side portions 28a-b, and bottom portion 30.

Digit panel 14 includes light emitting diodes (LEDs) and associated electronics for powering and controlling the operation of the LEDs. In the specific embodiment of FIG. 1, digit panel 14 is for a gas station, and is configured to display the price of gasoline in a lighted manner. Digit panel 14 may be received in frame 24 such that cabinet 12 physically supports panel 14 and holds panel 14 in place. When digit panel 14 is received in frame 24, a substantially rectangular or box-shaped air chamber 32 is defined between digit panel 14, rear wall 16, top wall 18, side walls 20a-b, and bottom wall 22.

Bottom portion 30 of frame 24 may include a series of throughholes or louvers 34 through which air chamber 32 may be in fluid communication with ambient air. Digit panel 14 may include throughholes 36 along a bottom edge of panel 14 wherein throughholes 36 are aligned with louvers 34 such that panel 14 does not block the fluid communication between air chamber 32 and ambient air. In another embodiment, however, panel 14 does not extend downwardly as far as louvers 34, and thus panel 14 does not include throughholes 36 because panel 14 does not block fluid communication between air chamber 32 and ambient air anyway.

A vertical partition 38 may be disposed in air chamber 32 between side walls 20a-b. Thereby, air chamber 32 may be divided into two adjacent sections 40a-b. Near a top end of vertical partition 38 is an electric-powered fan 42. Fan 42 may be considered herein to be simultaneously disposed within cabinet 12, within air chamber 32, and within partition 38. A front edge of partition 38 may be sealed against digit panel 14 in an air-tight manner such that sections 40a-b are substantially fluidly sealed from each other except through fan 42. Fan 42 may draw ambient air through louvers 34 into one of sections 40a-b. Fan 42 may then blow the air into the other one of sections 40a-b and out of chamber 32 through louvers 34. Optionally, partition 38 may include one or more throughholes 44 for enabling wires and other conduits to pass between sections 40a-b. Although throughhole 44 is shown to be of a relatively large size in FIG. 1 for ease of illustration, throughholes 44 may be smaller than the one shown, and there may possibly be more than one, or numerous, such throughholes in partition 38.

Figure 2:
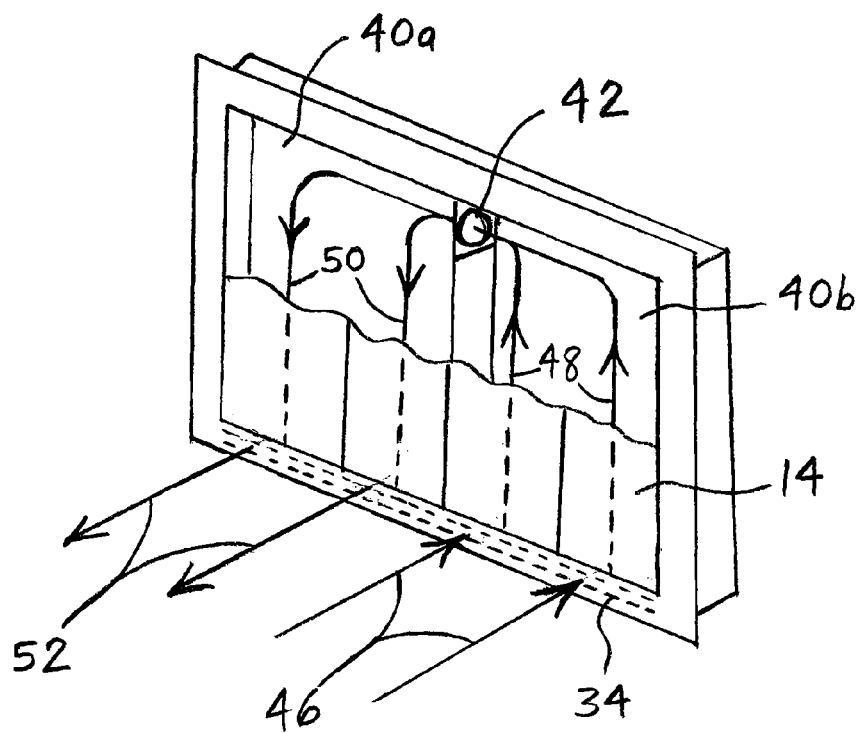
FIG. 2 is a partially fragmentary, perspective view of the sign ventilation system of FIG. 1, illustrating the air flow therethrough.

FIG. 2 illustrates the air flow path through the assembled sign ventilation system 10. In this particular embodiment, fan 42 is configured to blow air from section 40b to section 40a. As indicated by arrows 46, fan 42 draws ambient air into section 40b through louvers 34. As indicated at 48, fan 42 draws the ambient air upwardly through section 40b and into fan 42. The air absorbs heat from digit panel 14 as the air flows upwardly through section 40b. As indicated at 50, fan 42 blows the air downwardly through section 40a. The air absorbs more heat from digit panel 14 as the air flows downwardly through section 40a. Finally, as indicated by arrows 52, fan 42 blows the heated air out of section 40a through louvers 34.

In another embodiment (not shown), the fan is not within partition 38, but rather is disposed in digit panel 14, adjacent to an upper portion of a front edge of partition 38. In this embodiment, the fan is still fluidly connected to each of the two sections of the air chamber, and thus is configured to transfer air from one of the sections to the other. Advantageously, the fan may be easily connected to electrical power with digit panel 14.

Figure 3:
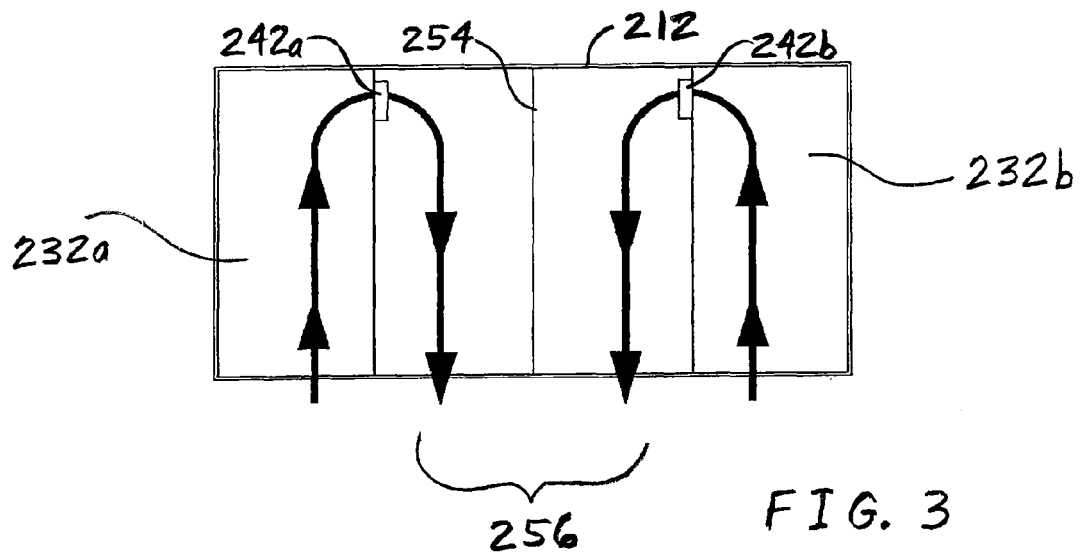
FIG. 3 is an air flow diagram of another embodiment of a sign ventilation system of the present invention including two chambers.

The embodiment of FIGS. 1-2 includes a sign with only a single ventilated sign module, e.g., only a single chamber. However, it is to be understood that the invention may be applied to a multi-chamber sign wherein a series of ventilated sign modules, each having its own air chamber, are horizontally adjacent to each other or vertically adjacent to each other. FIG. 3 illustrates the air flow in a scenario in which a sign includes two horizontally adjacent chambers. Specifically, cabinet 212 includes two adjacent chambers 232a-b divided by a vertical partition 254 which fluidly isolates chambers 232a-b from each other, but may possibly include one or more throughholes in order to allow some air to pass therebetween.

A fan 242a is oriented such that air flows through chamber 232a in a clockwise (CW) direction from the perspective of FIG. 3. Conversely, a fan 242b is oriented such that air flows through chamber 232b in a counterclockwise (CCW) direction. This opposite direction of air flow in adjacent chambers 232a-b may have the advantage that the exhausts 256 of chambers 232a-b are adjacent to each other, thereby reducing turbulence and increasing the overall flow of air. Alternatively, if each chamber had a same direction of airflow (CC or CCW) then, in a long string of adjacent chambers, each air intake would be adjacent to only air exhausts, and each air exhaust would be adjacent to only air intakes, which would increase turbulence and reduce overall air flow.

More generally, in a longer series of adjacent chambers, such as chambers 332a-g (FIG. 4a), the direction of air flow is alternatingly CW and CCW along the line of chambers 332a-g. Thus, except for the exhaust of chamber 332a and the intake of chamber 332g, each intake is adjacent to another intake, and each exhaust is adjacent to another exhaust. Thus, turbulence surrounding the intakes and exhausts may be reduced, and the rate of air flow may be increased.

Figure 4A:
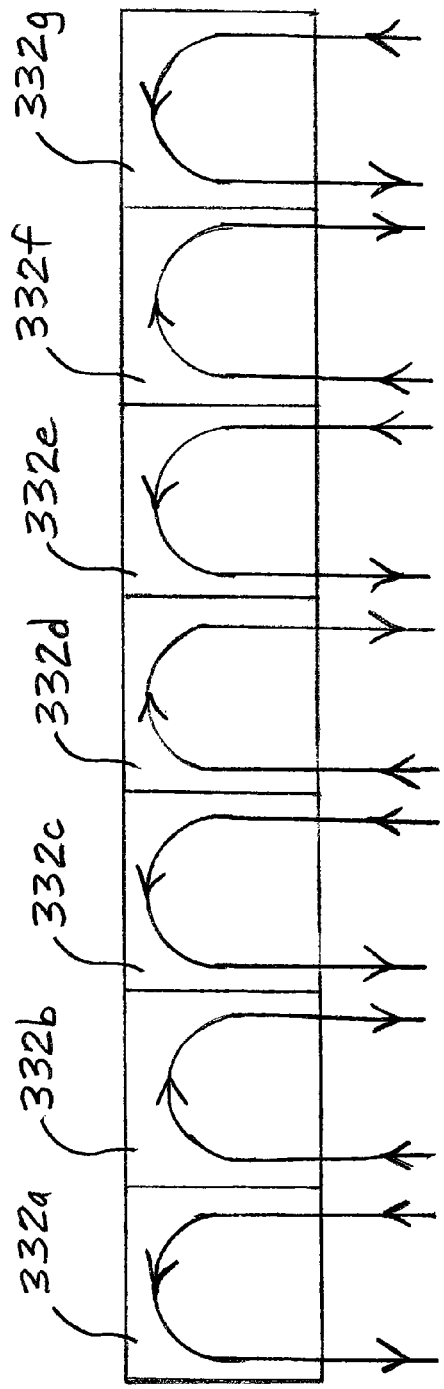
FIG. 4a is an air flow diagram of yet another embodiment of a sign ventilation system of the present invention including seven horizontally adjacent chambers.
Figure 4B:
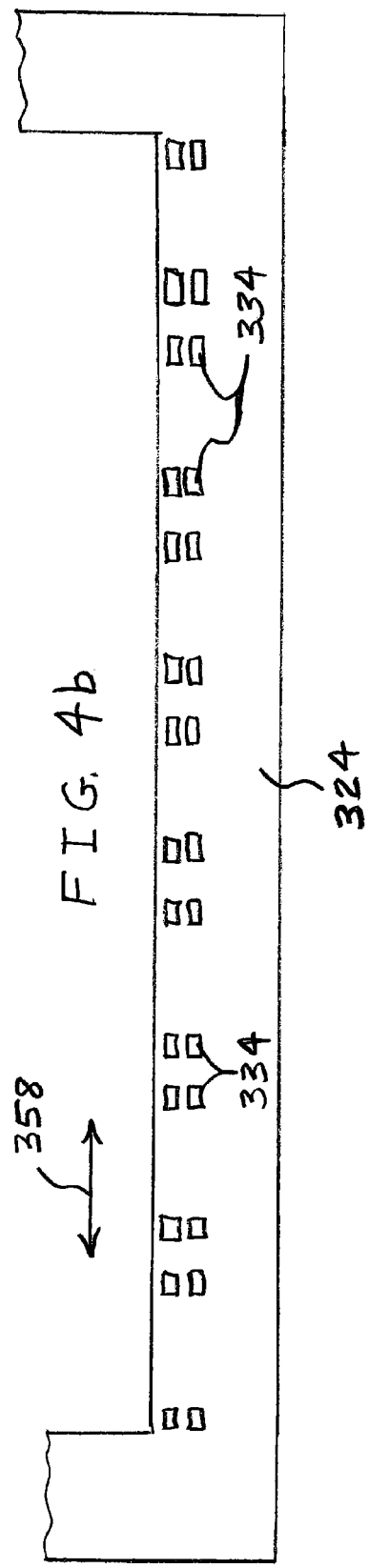
FIG. 4b is a front view of a cabinet frame which may be used in conjunction with the sign ventilation system of FIG. 4a, including one specific embodiment of a louver pattern.

In order to further reduce the turbulence caused by adjacent oppositely directed flows of air, a cabinet frame 324 (FIG. 4b) may have a pattern of louvers 334 as shown in FIG. 4b, which may be advantageously used in conjunction with the pattern of air flows in FIG. 4a. As may be determined by looking at FIGS. 4a-b at the same time, louvers 334 are arranged in clusters that are offset from each other by distances in a width direction indicated by double arrow 358. All of the louvers 334 in a same cluster may be closer in proximity to each other than to louvers 334 of any other cluster. All of the louvers 334 in a same cluster may be used for air intake, or all of the louvers 334 in a same cluster may be used for air exhaust. Thus, turbulence caused by closely adjacent air flows moving in opposite directions may be reduced.

Figure 5A:
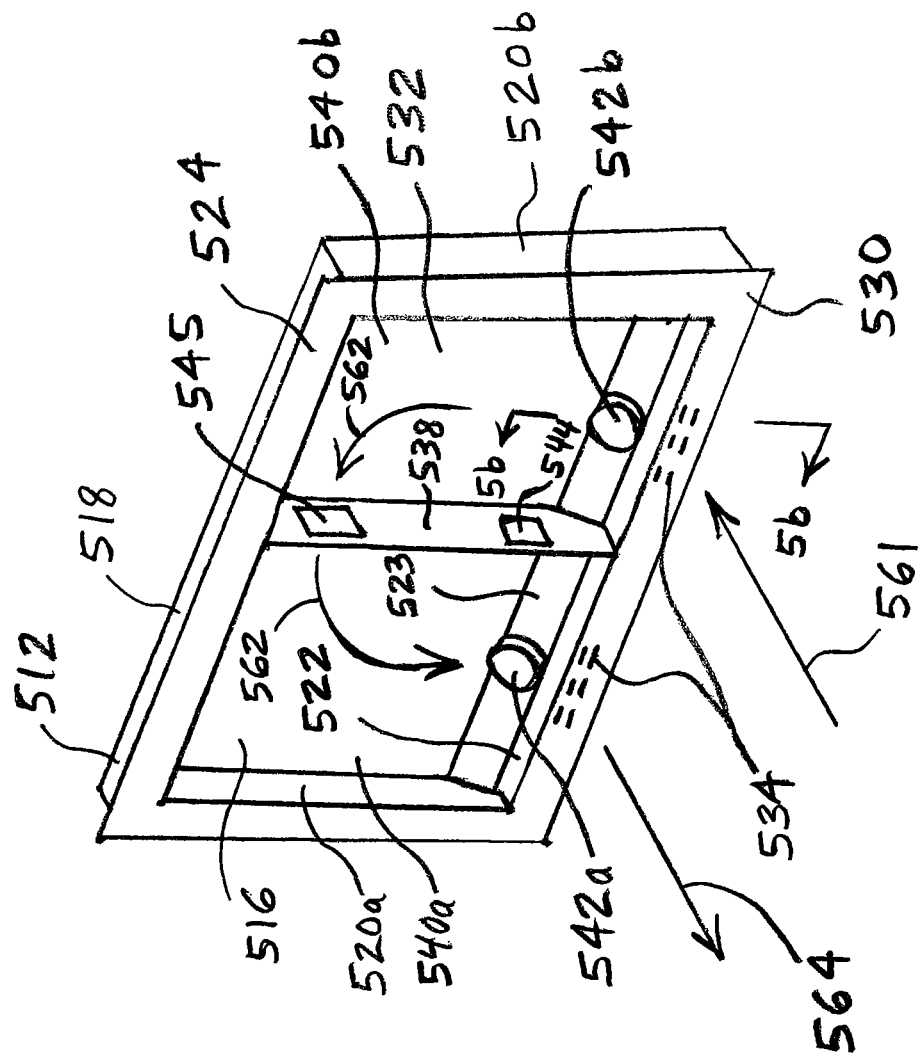
FIG. 5a is a perspective view of yet another embodiment of a cabinet suitable for a sign ventilation system of the present invention.

Another embodiment of a cabinet 512 of the present invention is shown in FIG. 5a. Cabinet 512 may include a rear wall 516, top wall 518, side walls 520a-b, bottom wall 522, slanted wall 523, and a front frame 524. A bottom portion 530 of frame 524 may include two clusters or subsets of throughholes or louvers 534 through which an air chamber 532 may be in fluid communication with ambient air after a digital panel such as digital panel 14 is inserted into cabinet 512.

A vertical partition 538 may be disposed in air chamber 532 between side walls 520a-b. Thereby, air chamber 532 may be divided into two adjacent sections 540a-b. Electric-powered fans 542a-b may be disposed in slanted wall 523 in sections 540a-b, respectively. Fans 542a-b may be considered herein as being disposed within cabinet 512 and within air chamber 532. Partition 538 may include a throughhole 544 for enabling wires and other conduits to pass between sections 540a-b.

Figure 5B:
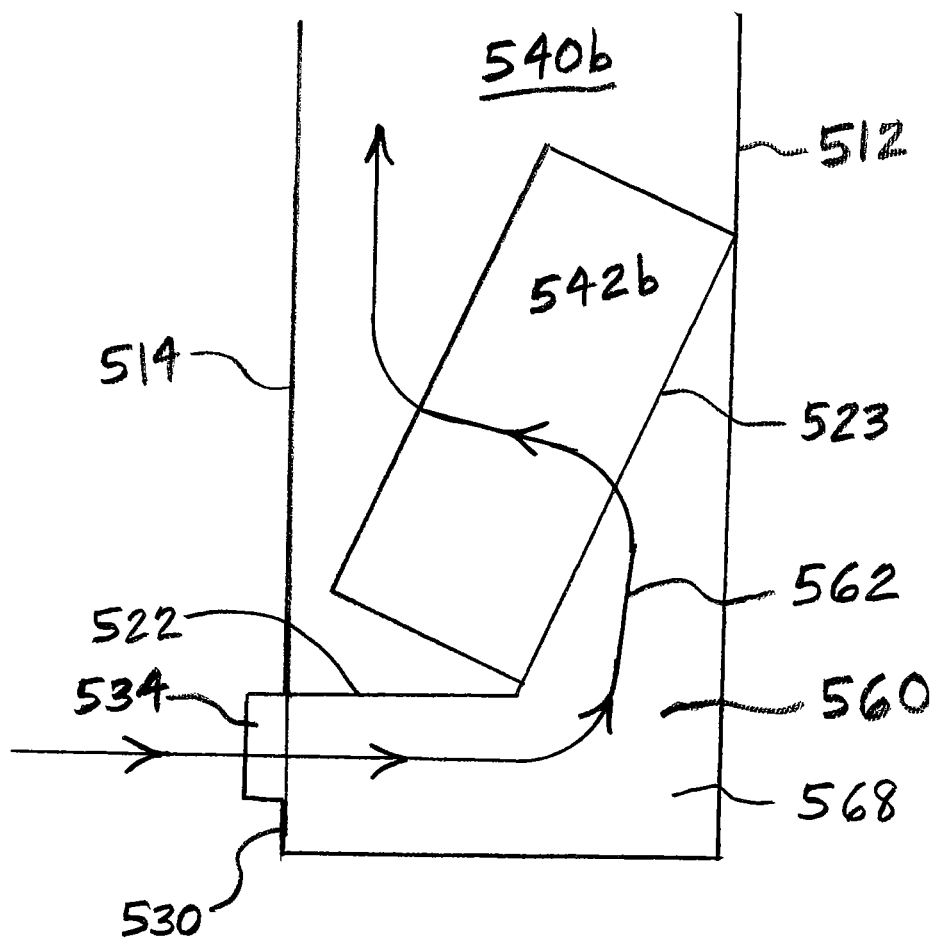

As shown in FIG. 5b, an air flow channel 560 is disposed in cabinet 512 below bottom wall 522 and slanted wall 523 in section 540b. Air flow channel 560 fluidly interconnects a first subset of louvers 534 with fan 542b. Fan 542b may draw ambient air through the first subset of louvers 534 into section 540b, as indicated at 561 (FIG. 5a) and at 562 (FIG. 5b). Fan 542b may then blow the air through a throughhole 545 and into section 540b.

The structure of cabinet 512 below fan 542a, bottom wall 522 and slanted wall 523 in section 540a may be substantially identical to the structure shown in FIG. 5b. However, there may be a substantially air-tight wall 568 between air flow channel 560 and a substantially identical air flow channel below section 540a to force the air to flow through air chamber 532. Thus, fan 542a may draw the air down through section 540a, through the air flow channel therebelow, and out of chamber 532 through a second subset of louvers 534, as indicated at 564 (FIG. 5a).

It is to be understood that a series of ventilated sign modules, each having its own cabinet 512, may be placed in a line or series as shown in FIG. 4a such that the cabinets 512 are horizontally adjacent to each other. In this configuration, each of the cabinets 512 may be effectively cooled despite some of the cabinets 512 being in the middle of the series and disposed far from the lateral ends of the series.

A further embodiment of a cabinet 612 of the present invention is shown in FIG. 6a. Cabinet 612 may include a rear wall 616, top wall 618, side walls 620a-b, bottom wall 622, slanted wall 623, and a front frame 624. A bottom portion 630 of frame 624 may include two clusters or subsets of throughholes or louvers 634 through which an air chamber 632 may be in fluid communication with ambient air after a digital panel such as digital panel 14 is inserted into cabinet 612.

A vertical partition 638 may be disposed in air chamber 632 between side walls 620a-b. Thereby, air chamber 632 may be divided into two adjacent sections 640a-b. An electric-powered fan 642 may be disposed in slanted wall 623 in section 640b. A throughhole 665 may be disposed in slanted wall 623 in section 640a. Partition 638 may include a throughhole 644 for enabling wires and other conduits to pass between sections 640a-b.

Figure 6B:
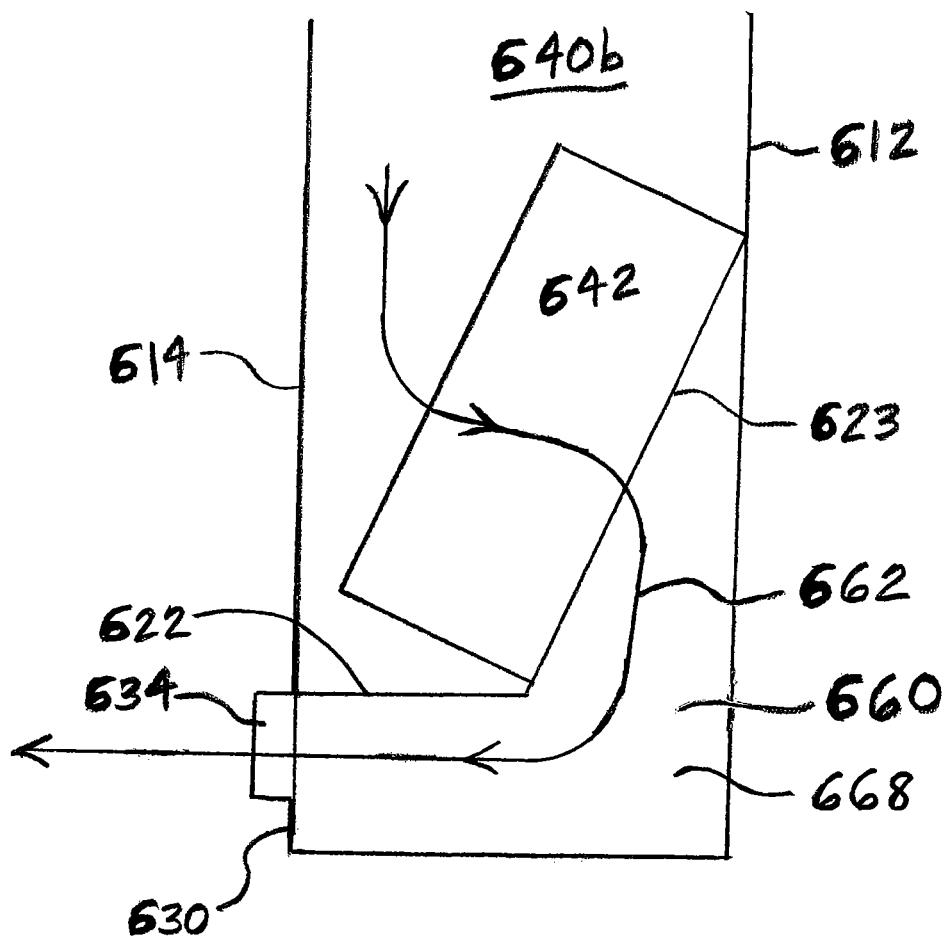

As shown in FIG. 6b, an air flow channel 660 is disposed in cabinet 612 below bottom wall 622 and slanted wall 623 in section 640b. Air flow channel 660 fluidly interconnects a first subset of louvers 634 with fan 642. Fan 642 may exhaust air from section 640b through the first subset of louvers 634, as indicated at 661 (FIG. 6a) and at 662 (FIG. 6b). Fan 642 may also draw the air from section 640a to section 640b through a throughhole 645.

The structure of cabinet 612 below bottom wall 622 and slanted wall 623 in section 640a may be substantially identical to the structure shown in FIG. 6b. However, there may be a substantially air-tight wall 668 between air flow channel 660 and a substantially identical air flow channel below section 640a to force the air to flow through air chamber 632. Thus, fan 642 may draw the air through a second subset of louvers 634, as indicated at 664 (FIG. 6a), through the air flow channel below section 640a, through throughhole 665, up through section 640a, and through throughhole 645 into section 640b.

It is to be understood that a series of ventilated sign modules, each having its own cabinet 612, may be placed in a line or series as shown in FIG. 4a such that the cabinets 612 are horizontally adjacent to each other. In this configuration, each of the cabinets 612 may be effectively cooled despite some of the cabinets 612 being in the middle of the series and disposed far from the lateral ends of the series.

While this invention has been described as having an exemplary design, the present invention may be further modified within the spirit and scope of this disclosure. This application is therefore intended to cover any variations, uses, or adaptations of the invention using its general principles.

What is claimed is:

1. A ventilated electronic sign module, comprising:
a substantially planar-shaped lighting module configured to emit light that is visible to a viewer of the sign;
a cabinet supportingly engaging the lighting module, the cabinet including a rear wall, two opposing side walls, a top wall and a bottom wall, the rear wall being disposed opposite the lighting module such that an air chamber is defined between the cabinet and the lighting module;
a substantially vertical partition disposed within the air chamber and extending between the bottom wall and the top wall, and between the lighting module and the rear wall, the partition dividing the air chamber into a first section and a second section; and
an electric fan disposed within the cabinet and configured to transfer air from the first section to the second section;
wherein the cabinet and/or the lighting module include a plurality of throughholes fluidly interconnecting the air chamber to ambient air, a first subset of the throughholes being more closely fluidly connected to the first section than to the second section, a second subset of the throughholes being more closely fluidly connected to the second section than to the first section,
wherein the cabinet includes an air channel at least partially below the bottom wall and directly fluidly connected to the first subset of the throughholes, the fan directly fluidly interconnecting the air channel and the first section; and
wherein the cabinet includes a slanted wall interconnecting the rear wall and the bottom wall, the fan being disposed in the slanted wall.

2. A ventilated electronic sign module, comprising:
a substantially planar-shaped lighting module configured to emit light that is visible to a viewer of the sign;
a cabinet supportingly engaging the lighting module, the cabinet including a rear wall, two opposing side walls, a top wall and a bottom wall, the rear wall being disposed opposite the lighting module such that an air chamber is defined between the cabinet and the lighting module;

a substantially vertical partition disposed within the air chamber and extending between the bottom wall and the top wall, and between the lighting module and the rear wall, the partition dividing the air chamber into a first section and a second section; and an electric fan disposed within the cabinet and configured to transfer air from the first section to the second section;

wherein the cabinet and/or the lighting module include a plurality of throughholes fluidly interconnecting the air chamber to ambient air, a first subset of the throughholes being more closely fluidly connected to the first section than to the second section, a second subset of the throughholes being more closely fluidly connected to the second section than to the first section; and wherein the fan is disposed within the partition.

3. An electronic sign, comprising a plurality of ventilated electronic sign modules, the modules being substantially aligned in a horizontal direction and each module being disposed horizontally adjacent to one or two other said modules, each said module including:

a substantially planar-shaped lighting module configured to emit light that is visible to a viewer of the sign;

a cabinet supportingly engaging the lighting module, the cabinet having a rear wall, two opposing side walls, a top wall and a bottom wall, the rear wall being disposed opposite the lighting module such that an air chamber is defined between the cabinet and the lighting module;

a substantially vertical partition disposed within the air chamber and extending between the bottom wall and the top wall, and between the lighting module and the rear wall, the partition dividing the air chamber into a first section and a second section;

an electric fan disposed within the cabinet or the lighting module and configured to transfer air from the first section to the second section;

wherein the cabinet and/or the lighting module have a plurality of throughholes fluidly interconnecting the air chamber to ambient air, a first subset of the throughholes being more closely fluidly connected to the first section than to the second section, a second subset of the throughholes being more closely fluidly connected to the second section than to the first section; and wherein first ones of the modules circulate the air in a clockwise direction within their respective air chambers, and second ones of the modules circulate the air in a counterclockwise direction within their respective air chambers, each said first module being adjacent to only one or two said second modules, each said second module being adjacent to only one or two said first modules.

4. The sign of claim 3, wherein the throughholes are arranged in clusters, the throughholes of at least one said cluster including both a first throughhole fluidly connected to a first one of two adjacent said modules and a second throughhole fluidly connected to a second one of the two adjacent said modules.

5. An electronic sign, comprising a plurality of ventilated electronic sign modules, the modules being substantially aligned in a horizontal direction and each module being disposed horizontally adjacent to one or two other said modules, each said module including:

a substantially planar-shaped lighting module configured to emit light that is visible to a viewer of the sign;

a cabinet supportingly engaging the lighting module, the cabinet having a rear wall, two opposing side walls, a top wall and a bottom wall, the rear wall being disposed opposite the lighting module such that an air chamber is defined between the cabinet and the lighting module;

a substantially vertical partition disposed within the air chamber and extending between the bottom wall and the top wall, and between the lighting module and the rear wall, the partition dividing the air chamber into a first section and a second section;

an electric fan disposed within the cabinet or the lighting module and configured to transfer air from the first section to the second section;

wherein the cabinet and/or the lighting module have a plurality of throughholes fluidly interconnecting the air chamber to ambient air, a first subset of the throughholes being more closely fluidly connected to the first section than to the second section, a second subset of the throughholes being more closely fluidly connected to the second section than to the first section; and wherein the cabinet includes:

a slanted wall interconnecting the rear wall and the bottom wall, the fan being disposed in the slanted wall; and an air channel at least partially below the bottom wall and at least partially adjacent the slanted wall, the air channel being directly fluidly connected to the first subset of the throughholes, the fan directly fluidly interconnecting the air channel and the first section.

6. An electronic sign, comprising a plurality of ventilated electronic sign modules, the modules being substantially aligned in a horizontal direction and each module being disposed horizontally adjacent to one or two other said modules, each said module including:

a substantially planar-shaped lighting module configured to emit light that is visible to a viewer of the sign;

a cabinet supportingly engaging the lighting module, the cabinet having a rear wall, two opposing side walls, a top wall and a bottom wall, the rear wall being disposed opposite the lighting module such that an air chamber is defined between the cabinet and the lighting module;

a substantially vertical partition disposed within the air chamber and extending substantially an entire span between the bottom wall and the top wall, and extending substantially an entire span between the lighting module and the rear wall, the partition dividing the air chamber into a first section and a second section;

an electric fan disposed within the partition and configured to transfer air from the first section to the second section;

wherein the cabinet and/or the lighting module have a plurality of throughholes fluidly interconnecting the air chamber to ambient air, a first subset of the throughholes being more closely fluidly connected to the first section than to the second section, a second subset of the throughholes being more closely fluidly connected to the second section than to the first section; and wherein first ones of the modules circulate the air in a clockwise direction within their respective air chambers, and second ones of the modules circulate the air in a counterclockwise direction within their respective air chambers, each said first module being adjacent to only one or two said second modules, each said second module being adjacent to only one or two said first modules.

7. The sign of claim 6, wherein the throughholes are arranged in clusters, the throughholes of at least one said cluster including both a first throughhole fluidly connected to a first one of two adjacent said modules and a second throughhole fluidly connected to a second one of the two adjacent said modules.

8. An electronic sign, comprising a plurality of ventilated electronic sign modules, the modules being substantially aligned in a horizontal direction and each module being disposed horizontally adjacent to one or two other said modules, each said module including:
- a substantially planar-shaped lighting module configured to emit light that is visible to a viewer of the sign;
- a cabinet supportingly engaging the lighting module, the cabinet having a rear wall, two opposing side walls, a top wall and a bottom wall, the rear wall being disposed opposite the lighting module such that an air chamber is defined between the cabinet and the lighting module;
- a substantially vertical partition disposed within the air chamber and extending substantially an entire span between the bottom wall and the top wall, and extending substantially an entire span between the lighting module and the rear wall, the partition dividing the air chamber into a first section and a second section;
- an electric fan disposed within the partition and configured to transfer air from the first section to the second section;

wherein the cabinet and/or the lighting module have a plurality of throughholes fluidly interconnecting the air chamber to ambient air, a first subset of the throughholes being more closely fluidly connected to the first section than to the second section, a second subset of the throughholes being more closely fluidly connected to the second section than to the first section; and wherein the cabinet includes:

a slanted wall interconnecting the rear wall and the bottom wall, the fan being disposed in the slanted wall; and an air channel at least partially below the bottom wall and at least partially adjacent the slanted wall, the air channel being directly fluidly connected to the first subset of the throughholes, the fan directly fluidly interconnecting the air channel and the first section.

* * * * *